United States Patent [19]
Cavazos

[11] Patent Number: 5,583,096
[45] Date of Patent: Dec. 10, 1996

[54] SUPERCONDUCTIVE COMPOUNDS AND PROCESS FOR PRODUCING SAID COMPOUNDS

[76] Inventor: Ramon G. Cavazos, Paseo de la Reforma 403, Primer Piso, Mexico, D.F. 06500

[21] Appl. No.: 392,403

[22] Filed: Feb. 22, 1995

Related U.S. Application Data

[63] Continuation of Ser. No. 115,251, Sep. 1, 1993, abandoned, which is a continuation of Ser. No. 824,083, Jan. 22, 1992, abandoned, which is a continuation-in-part of Ser. No. 717,180, Jun. 18, 1991, abandoned, which is a continuation of Ser. No. 311,066, Feb. 16, 1989, abandoned.

[51] Int. Cl.$^6$ .................................................. C04B 35/45
[52] U.S. Cl. ........................ 505/490; 505/125; 505/500; 505/739; 423/593; 264/65; 501/123
[58] Field of Search .............................. 501/123; 264/65; 505/779, 781, 125, 126, 500, 739; 252/521; 423/593

[56] References Cited

U.S. PATENT DOCUMENTS

| | | | |
|---|---|---|---|
| 4,843,059 | 7/1989 | Deslandes et al. | 501/152 |
| 5,004,725 | 4/1991 | Ovshinsky et al. | 301/152 |

FOREIGN PATENT DOCUMENTS 2515874  10/1975  Germany.

OTHER PUBLICATIONS

Beno et al, "Structure of the single phase high–temperature superconducting $YBa_2Cu_3O_{7-\delta}$", *Appl Phys Lett*, vol. 51, No. 1, 6 Jul. 1987, pp. 57–59 *Ceramic Processing*, NAGS, 1968 pp. 24–25.

Hien et al, "Infuence of the Fe and Mn Substitution on the Crytal Structure and Superconducting Proprties of 1:2:3 Compounds", Phy. Stat. Sol. (a), 131, 6/92, K47–K51.

*Primary Examiner*—Melissa Bonner
*Attorney, Agent, or Firm*—Nies, Kurz, Bergert & Tamburro

[57] ABSTRACT

A process of manufacturing a superconducting compound including mixing stoichiometric amounts of a metallic oxide, copper oxide and a metallic carbonate wherein the metal of the metallic oxide is one other than yttrium and is selected and identified by its intrinsic massivity which is close in value to the intrinsic massivity of yttrium and wherein the interplanar distance on the C axis between Cu—O planes that exchange electrons through the electron-hopping mechanism in the ceramic perovskite is within the range of 1.97 Å and 1.01 Å. The mixture is subjected to pressure to form pellets and the pellets are then heated in forming the compound. The compound produced by the process and ceramic compositions having the formulas $Mn\ Sr_2\ Cu_3\ O_{7-x}$ and $Mn_2\ Sr_2\ Cu_3\ O_{7-x}$.

4 Claims, 8 Drawing Sheets

Heat of Formation−ΔH at 298.15 K plotted against the product of massivities of the metal and oxygen atoms divided by the square of their atomic distances.
M+ −1.914368E−05   C=591.5396

Fig.1: Heat of Formation $-\Delta H$ at 298.15 K plotted against the product of massivities of the metal and oxygen atoms divided by the square of their atomic distances.
M+ −1.914368E−05  C= 591.5396

Fig. 2: Product of the massivities of the zinc and oxygen atoms divided by the square of their interatomic distance r12 plotted as a function of d(i).

Fig.3: $V_{ij} = hc\ B\ M_i\ M_j/d_{ij} + C$

Fig.4: Heat of formation $-\Delta H$ at 298.15 K plotted against the product of the massivities of the metal and oxygen atoms divided by the square of the interatomic distance.

Fig. 5: Interatomic potential between Zn and O in terms of their massivity as a function of their interatomic distance.
re=2.369748E-10 , rm=4.739496E-10 1
Heat of formation of ZnO at 298.1 ΔH=-84.29507 Kcal/mol LINEAR DEPENDANCE OF Tc WITH INTERPLANAR DISTANCE ON THE C AXIS

SUPERCONDUCTIVE COMPOUNDS AND PROCESS FOR PRODUCING SAID COMPOUNDS

This application is a continuation of application Ser. No. 08/115,251, filed Sep. 9, 1993, now abandoned, which is a continuation of application Ser. No. 07/824,083, filed Jan. 22, 1992, now abandoned, which is a continuation-in-part application Ser. No. 07/717,180, filed Jun. 18, 1991, now abandoned, which is a continuation of application Ser. No. 07/311,066, filed Feb. 16, 1989, now abandoned.

BACKGROUND OF THE INVENTION

The present invention relates to superconductive compounds which show superconductive characteristics in multiple phases at temperatures ranging from approximately 14 K. to 310 K. More particularly, this invention relates to a process for predicting the superconductive properties of compounds and identifying the most significant compounds which are superconductive by ambient temperatures, and to a process for the production of said compounds.

The recent discovery of high transition temperature superconductors represents a possible technological revolution and has attracted the interest of scientists from around the world. These new materials are ceramics, made from metal oxides.

During the past two years, many studies have been reported following the discovery of the efficacy of La—Ba—Cu—O materials. This system has been extensively analyzed and has a transition temperature around 30 K. Subsequently a Y—Ba—Cu—O material having a 90 K. transition temperature was obtained. Many other 90 K. superconducting materials have been obtained substituting a rare earth element for the yttrium.

From X-Ray studies the crystalography of these 90 K. compounds is well known. These superconductors (R—Ba—Cu—O, R=Y, rare earth) have been called 1,2,3 compounds because of their stoichiometry and present an orthorhombic unit cell, which can be visualized as a stacking of three perovskites.

Compounds based on bismuth (Bi—Sr—Cu—O) which show superconductive characteristics with transition temperatures in the range from 90 K. to 120 K. have also been reported. The bismuth-based compounds have been modified by adding calcium, producing superconductive ceramic compounds of the type Bi—Sr,Ca—Cu—O.

From the point of view of possible applications of these materials, it is important to emphasize that they are superconductors above the liquid nitrogen temperature. However, an increase in their transition temperature widens technological possibilities even more.

As it can be inferred from the above, the technology developed so far is greatly limited by the fact that, in order to achieve the phenomenon of superconductivity, it is necessary to cool the materials by means of liquid nitrogen, which represents a serious limitation as to the possibility of using such materials for practical applications. Hence, ongoing research has focused on the development of superconductive materials which can operate efficiently at higher temperatures, ideally at ambient temperatures.

All of these ceramic materials are produced through solid state reactions of appropriate amounts of the original oxides. Nevertheless, what determines the quality and characteristics of the products, other than their composition, are the times, temperatures and conditions involved in each step of the process, as well as the number of times the steps are repeated. In the past the primary method of identifying materials having the best superconductive properties has been by trial and error.

SUMMARY OF THE INVENTION

The present provides a process for predicting the superconductive properties of materials and identifying the most significant materials which are superconductive at ambient temperatures, and for producing superconductive compounds from those materials. The present invention also provides superconductive compounds with new compositions, based on metal oxides, which present higher superconducting transition temperatures, as well as a process for obtaining the same. The present invention also provides a process for producing such compounds, which process consists essentially of a solid state reaction with specific times, temperatures and oxidation conditions, which determine the characteristics of the compounds. In addition, our new compounds present optical characteristics different from the already well-known 90 K. superconductors.

A primary object of this invention is to provide a novel mathematical model by which one is able to predict the superconductive properties of materials and identify the most significant materials which are superconductive at ambient temperatures. Using that model, new compositions of manganese-based compounds which present superconducting transition temperatures in the range of from 87 K. to 310 K., approximately have been produced.

Another object is to provide a process for producing these new compounds, specifying the parameters which insure the reproducibility of the results.

The compounds are obtained by mixing powders of manganese oxide, strontium carbonate and copper oxide.

It has been found that the use of these particular components results in compounds which present superconducting transition temperatures in the range from 87 K. to 310 K., approximately. It is important to note that in these new stoichiometries the type of basic components is different from those known in the art.

The process for producing the above-mentioned compounds comprises first mixing appropriate amounts of the original components and then pressing the mixture to form pellets.

In one example, the pressed powders are subjected to the following heat treatment:

| Temperature C. | Time (hours) |
|---|---|
| 600 | 14 |
| 800 | 22 |
| 850 | 25 |

Thereafter, the pellets are ground to a fine powder and reheated for 27 hours at 800° C. The process is repeated at 850° C., for the same period of time. Afterwards, the materials are reground and reheated to 900° C. in an oxygen atmosphere, for 12 hours. The last step is repeated once more.

Finally, the powders are pressed into pellets and reheated at 900° C. in an oxygen atmosphere, for 12 hours.

DETAILED DESCRIPTION OF THE INVENTION

As mentioned in the above summary, powders of $Mn_2O_3$, $SrCO_3$ and $CuO$ of high purity are mixed, for example, in the proportion 2:2:3 to produce the compound $Mn_2 Sr_2 Cu_3 O_{7-x}$.

They are ground until homogeneity is reached and grain size of several microns is obtained. A pressed powder pellet of 1 cm in diameter and 0.5 cm thick is prepared with a pressure of 10 Kg/cm². the resulting pellet is heated to a temperature of 600° C. for approximately 14 hours. The temperature is then raised to a value of 800° C., and maintained approximately 22 hours. The temperature of the pellet is increased to 850° C. and maintained for approximately 25 hours. The compound obtained is a solid compact, blackish (bluish black) pellet. Laboratory experience has shown that there is an actual change in color from bluish-black at ambient temperature to purple at liquid nitrogen temperature and then back to bluish-black as the material is heated further. The purple color is associated with the permanganate negative ion $Mn O_4$ which indicates the degree of oxidation of the manganese corresponding to $Mn^{+7}$. This has the minimum ionic radius which in turn correlates to the minimum interplanar distance between cuprate planes associated with ambient temperature $T_c$ onset.

The pellet is ground and calcinated in the following sequence:

| Temperature °C. | Time (hours) |
| --- | --- |
| 800 | 27 (reground) |
| 850 | 27 (reground) |
| 900 | 12 (reground) |
| 900 | 12 (reground) |

The powder is pressed into pellets which are heated at 900° C. in an oxygen atmosphere for approximately 12 hours.

Figure 8:
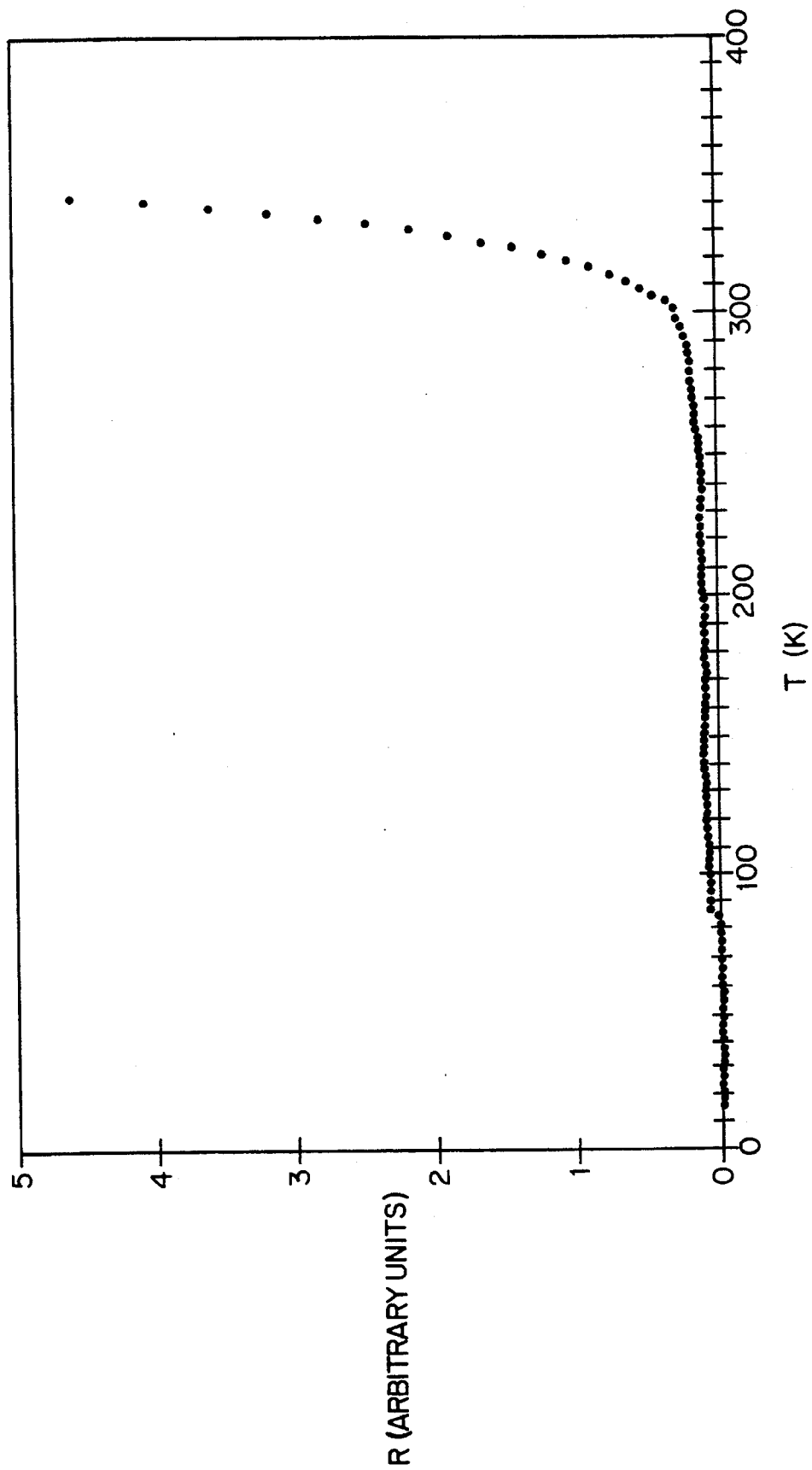
FIG. 8 shows a resistance (R=K-ohms) vs. temperature plot of a typical manganese-based sample of the present invention, showing a resistance drop temperature at 310 K., and other resistance drop to zero at a temperature of 87 K.

The variation of the resistance vs. temperature of the compound is measured. FIG. 8 shows a typical plot of resistance vs. temperature of the compound prepared in this way.

Cycling the temperature of the compound between ambient temperature and 4.2 K. proves that these behaviors are not affected by the temperature changes. Regarding the cycling tests, the number of cycles when cooling to liquid nitrogen temperature were performed at least 20 times, the compound used was the preferred 2-2-3 mode of the invention, and the cycling to 4.2 K. was carried out in a closed cycle liquid helium cryostat attached to a four probe zero resistivity device linked to a data gathering computer. Preparation of the samples made following this process was repeated several times, showing the same behavior.

As it is well known, the superconducting state is characterized by zero resistance measurement within the experimental precision. In this case, the resistance measurements were made by the usual fourpoint-probe technique in different configurations using silver point contacts.

As to the Meissner effect, laboratory tests have been made using a small magnet which was rejected by samples having the composition disclosed in the specification.

Another possible compound is the 1-2-3 mode, with the composition of $Mn Sr_2 Cu_3 O_{7-x}$.

As mentioned hereinabove, as part of my invention, I have developed a novel mathematical model, based on field theory and the potential well concept, by which one is able to predict the superconductive properties of materials and identify the most significant materials which are superconductive at ambient temperatures. This model explains the interaction between two bodies by relating the size of their respective potential wells to the strength of the interaction of each body in the following manner: Assume that the depth of each potential well depends directly on the quantity of mass of the body, and inversely on its volume, i.e., the larger the quantity the mass of the body, the deeper the potential well and the stronger the interaction potential. Assume also that the smaller the volume (the mass remaining unchanged) the deeper the potential well and the stronger the interaction potential. Assume additionally that the width of the potential well can be related to the distance from one body to the center of massivity (defined in a recursive manner, as the point P between two bodies A and B where the sum of the forces due to their respective interaction potentials as sensed by a probe object C is null) with respect to the other body. It then can be concluded that the longer the distance of one body to the center of massivity with respect to another body, the wider its potential well and the stronger its interaction. Therefore, in accordance with the novel model, by assuming that the size of the potential well depends directly on the quantity of matter and the distance to the center of massivity and inversely on the volume, the concept of MASSIVITY can be defined as follows:

The massivity of a body is a calculated property of matter, which depends on a) the relative position of that body with respect to another body (distance to the center of massivity as defined above), b) its quantity of matter (mass), and c) its geometry (volume), in accordance with the following equation:

$$M_{ic}=(d_{ic}-r_i)m_i/V_i \qquad (1)$$

where $M_{ic}$ is the Massivity of the body; $m_i$, $V_i$, and $r_i$ represent its mass, volume and radius, respectively, and $d_{ic}$ equals the distance from the center of the mass of the body to the center of massivity with respect to another body.

Based on the above, the massivity of a body is expressed in units of mass per unit area and its value varies when the volume of the body changes, even if its mass remains constant. For example, when an atom modifies its volume by losing or gaining electrons to become an ion, its massivity increases or decreases in consequence, although its mass remains practically constant. Also, two atoms approaching one another or receding from each other, modify their distance to the center of massivity thus changing their massivity, which can become null or even change sign during the process.

The center of massivity mentioned above corresponds, in a particular case of the three-body problem, to one of the so called Lagrange points which are the stable points where the forces are balanced, finding that all the calculations are simplified by referring them to this point.

In the course of this simplification process, the massivity of a body can be obtained for $d_{ic}=0$, and thus define this quantity as its intrinsic massivity. Therefore, the intrinsic massivity of any object can be stated as:

$$M_i = r_i m_i / V_i \quad (2)$$

Also, the massivity $M_{ic}$ of an object can be rewritten from equation (1) as follows:

$$M_{ic} = (1 - d_{ic}/r_i)(-r_i m_{ii} V_i) \quad (3)$$

and by making $$(1 = d_{ic}/r_i) = B_{ic} \quad (4)$$

from equations (2), (3) and (4) one can express the massivity $M_{ic}$ of any object as:

$$M_{ic} = B_{ic} M_i \quad (5)$$

where $B_{ic}$ is a coupling factor and $M_i$ the intrinsic massivity defined above.

In order to verify the validity of this model, it can be applied, for instance, to the case of the formation of simple molecules like those of metal monoxides.

Using equation (2), the values of their intrinsic massivity of ten metals chosen randomly are obtained and shown in Table I, listed in the increasing order of their atomic mass.

TABLE I

ATOMIC MASS AND MASSIVITY OF SELECTED METALS

| Element | Atomic Mass (a.m.u) | Intrinsic Massivity $M_i$(Kg/m$^2$) |
|---|---|---|
| Be | 9.01218 | −2.899751E-07 |
| Mg | 24.305 | −3.763851E-07 |
| Ti | 47.9 | −9.031842E-07 |
| V | 50.941 | −1.159035E-06 |
| Fe | 55.847 | −1.394554E-06 |
| Ni | 58.7 | −1.513462E-06 |
| Cu | 63.546 | −1.537606E-06 |
| Zn | 65.38 | −1.361017E-06 |
| Sr | 87.63 | −7.515409E-07 |
| Pd | 106.4 | −2.214931E-06 |

If these values are compared with the values at room temperature of the heat of formation $-\Delta H$ of their respective monoxides, a direct relationship can be seen from Table II, which shows that $-\Delta H$ increases as the intrinsic massivity of the metal becomes less negative. This suggests that the heat of formation could be calculated and expressed as a function of Massivity, whereas previously it could only be determined by experimentation.

TABLE II

HEAT OF FORMATION AS A FUNCTION OF MASSIVITY

| Oxide | Imperical Heat of Formation −ΔH(KJ/mol)* | Intrinsic Massivity $M_i$(Kg/m$^2$) |
|---|---|---|
| PdO | 112.55 | −2.214931E-06 |
| CuO | 155.22 | −1.537606E-06 |
| NiO | 239.7 | −1.513462E-06 |
| FeO | 266.3 | −1.394554E-06 |
| ZnO | 348.3 | −1.361017E-06 |
| VO | 431.79 | −1.159035E-06 |
| TiO | 542.6 | −9.031842E-07 |
| SrO | 592 | −7.515409E-07 |
| MgO | 601.8 | −3.763851E-07 |
| BeO | 610.9 | −2.899751E-07 |

*Source National Bureau of Standards, Circular 500

Also, it is known that the heat of formation of a molecule is a measure of the energy change during the process, and that it depends upon the interaction potentials of its constituent atoms. In the case of the oxide molecule formation, the metal loses electrons in the anodic reaction while the oxygen atom increases its number of electrons in the cathodic reaction, decreasing and increasing, respectively, the volume of the atoms. Also, the metal and oxygen atoms modify their distance to the center of massivity during the process.

From the above, and in an analogous manner to the standard interatomic potential models expressed as an inverse function of the distance, a function f that relates $-\Delta H$ directly with the product of the massivities of the metal and the oxygen atoms, and inversely with the square of the distance, can be stated as follows:

$$-\Delta H = f(M_{ic} M_{oc}/d(i)^2) \quad (6)$$

where $M_{ic}$ and $M_{oc}$ are the massivities of the metal and oxygen atoms, respectively, and d(i) is the interatomic distance.

Figure 1:
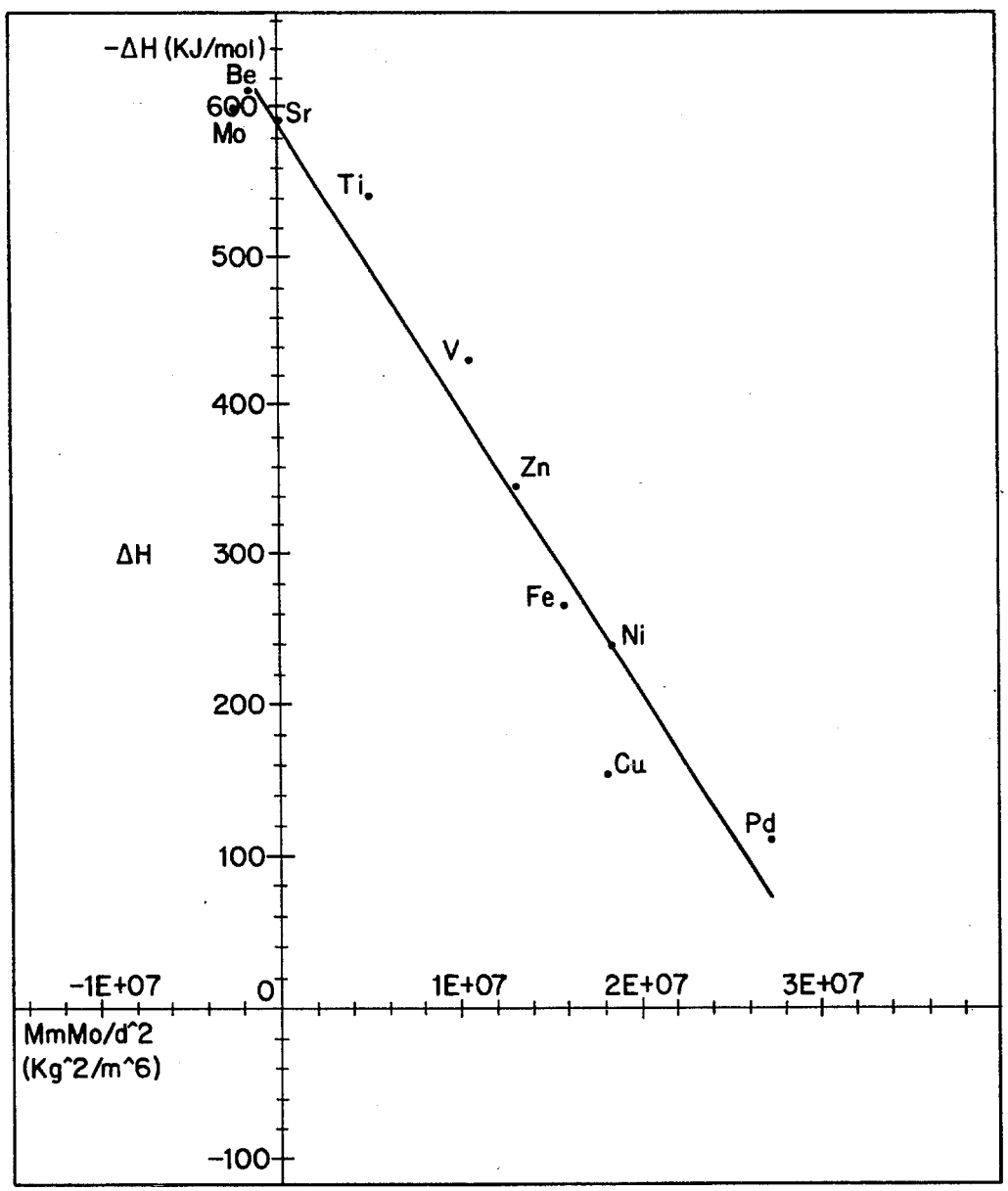
FIG. 1 is a graph plotting the heat of formation against the product of massisvities of the metal and oxygen atoms divided by the square of their interatomic distance.

Using equation (5) and the definition of the center of massivity, it is possible to obtain the massivity of the metal atoms with respect to the oxygen atom and of oxygen with respect to those metals. Substituting these values in equation (6) and making d(i) equal to two times the sum of the diameters of the metal and oxygen atoms, the plot shown in FIG. 1 is obtained, where the straight line results by applying linear regression to the data pairs (the correlation coefficient r=0.98).

Figure 2:
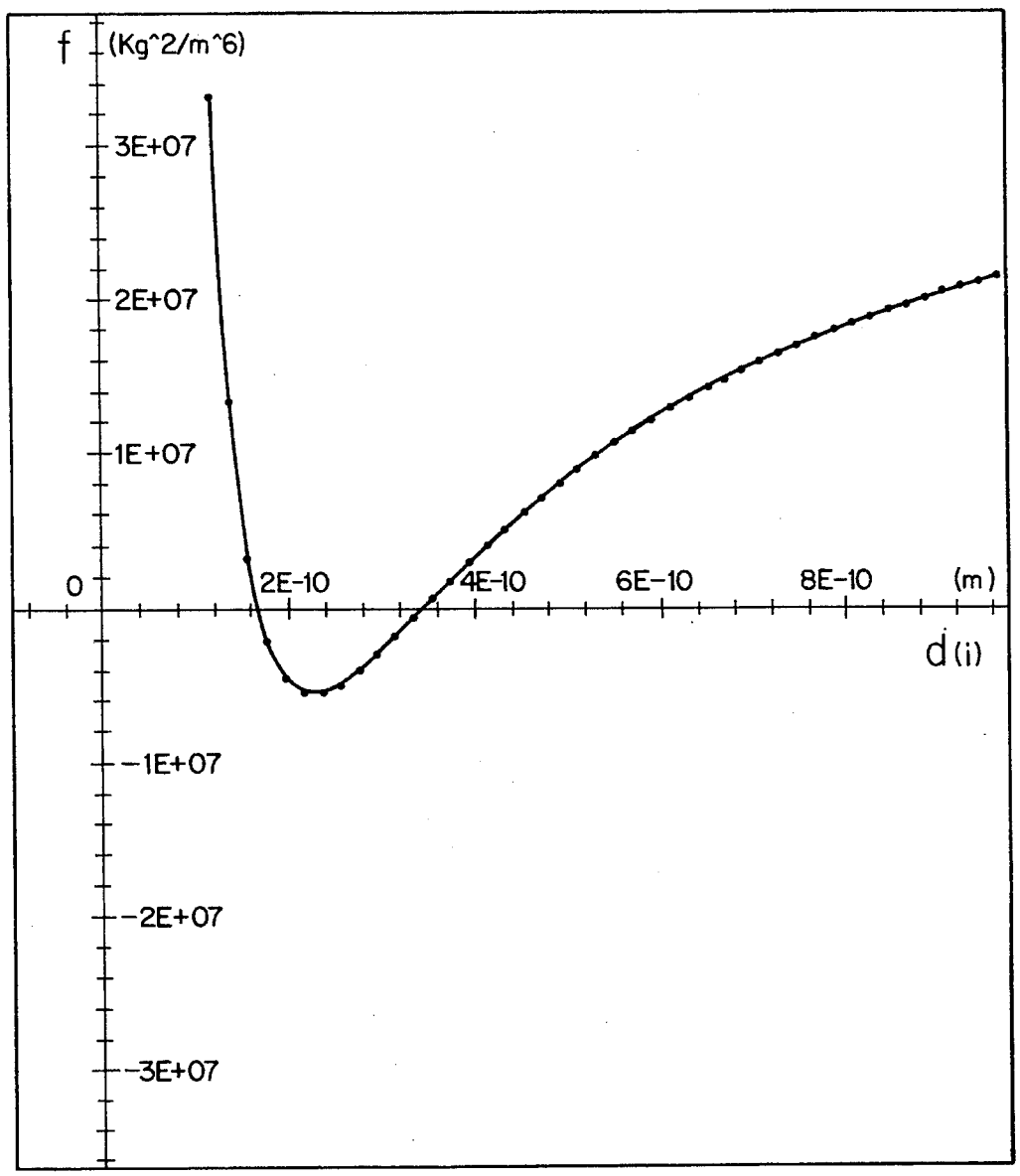
FIG. 2 is a graph plotting the product of the massivities of the zinc and oxygen atoms divided by the square of their interatomic distance as a function of d(i).

Additionally, by plotting the function $f = M_{ic} M_{oc}/d(i)^2$ against the interatomic distance d(i), taking the molecule of the zinc oxide as an example, the curve shown in FIG. 2 is obtained. This curve corresponds to the interatomic potential between a pair of atoms.

It is important to note that, in this case, the interatomic potential is obtained directly without resorting to the classical assumptions of the attractive and repulsive interactions, the sum of which generates the potential curve.

POTENTIAL MODEL

From above, a model can be proposed to express the interatomic potential $V_{ij}$ for any pair of atoms, as follows:

$$V_{ij} = k\, B_{ic} M_i\, B_{jc} M_j / d_{ij}^2 + C \quad (7)$$

where $M_i$ and $M_j$ are the intrinsic massivities of atoms i and j respectively, $B_{ic}$ and $B_{jc}$ are their coupling factors, $d_{ij}$ is the interatomic distance, k is a constant that corresponds to the slope of the straight line (FIG. 1), and C is the point where the straight line intersects the y axis.

In the international system of units, k equals Planck's constant multiplied by the velocity of light: hc=3.16e−25 Joule–m, and c equals −9.8e−19 Joule.

From above, and making $$B_{ic}\, B_{jc} = (1 - d_{ic}/r_i)(1 - d_{jc}/r_j) = B \quad (8)$$

where $r_i$ and $r_j$ are the radii of atom i and atom j, respectively, and B the coupling factor between them, (7) can be rewritten as:

$$V_{in} = hcBM_i\, M_j / d_{ij}^2 + C \quad (9)$$

Figure 3:
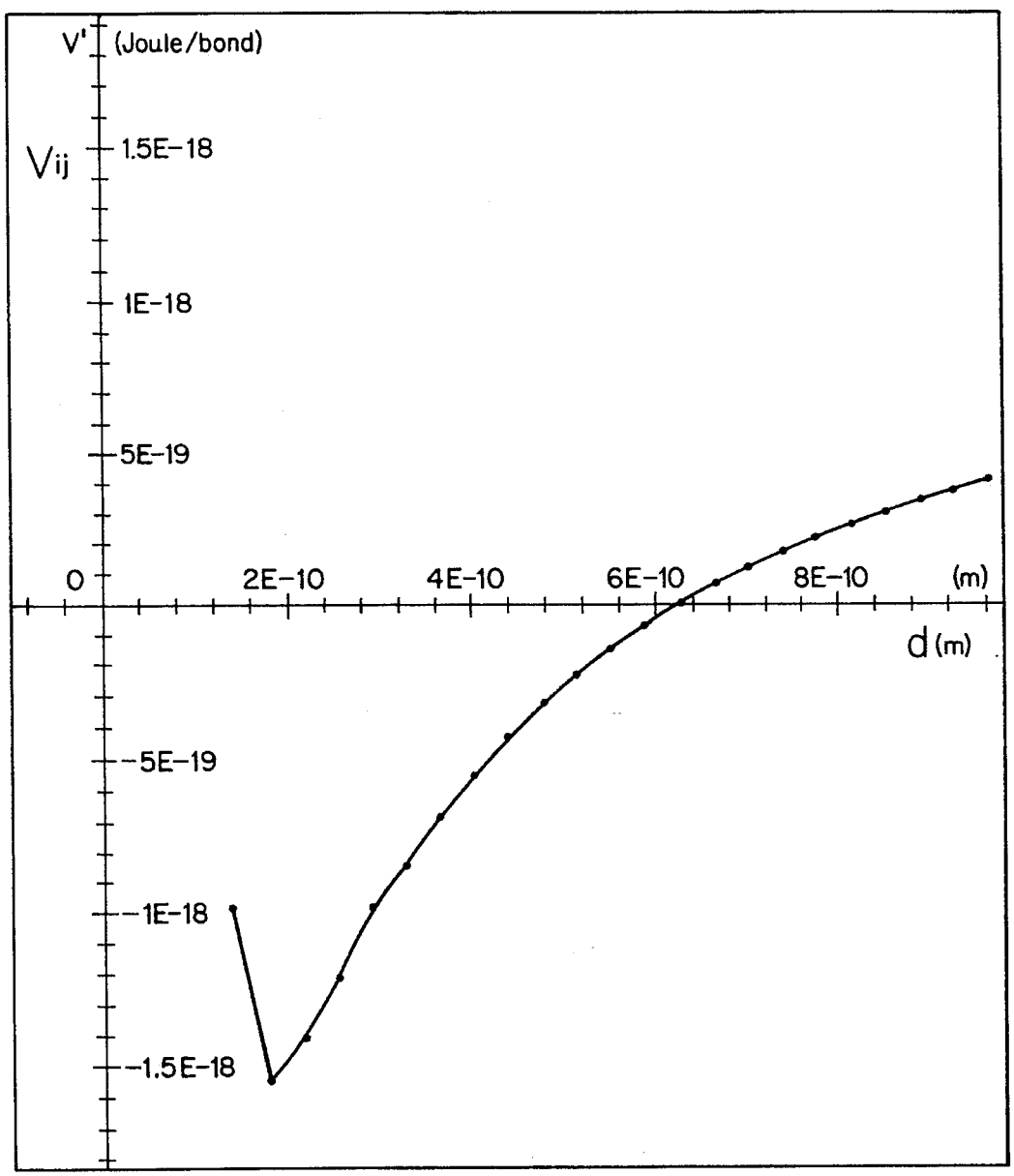
FIG. 3 is a graph corresponding in a first approximation to the interatomic potential of the zinc oxide molecule.

Applying equation (9) to the zinc monoxide example, the plot shown in FIG. 3 is obtained. This plot corresponds in a first approximation to the interatomic potential of the ZnO molecule.

Figure 4:
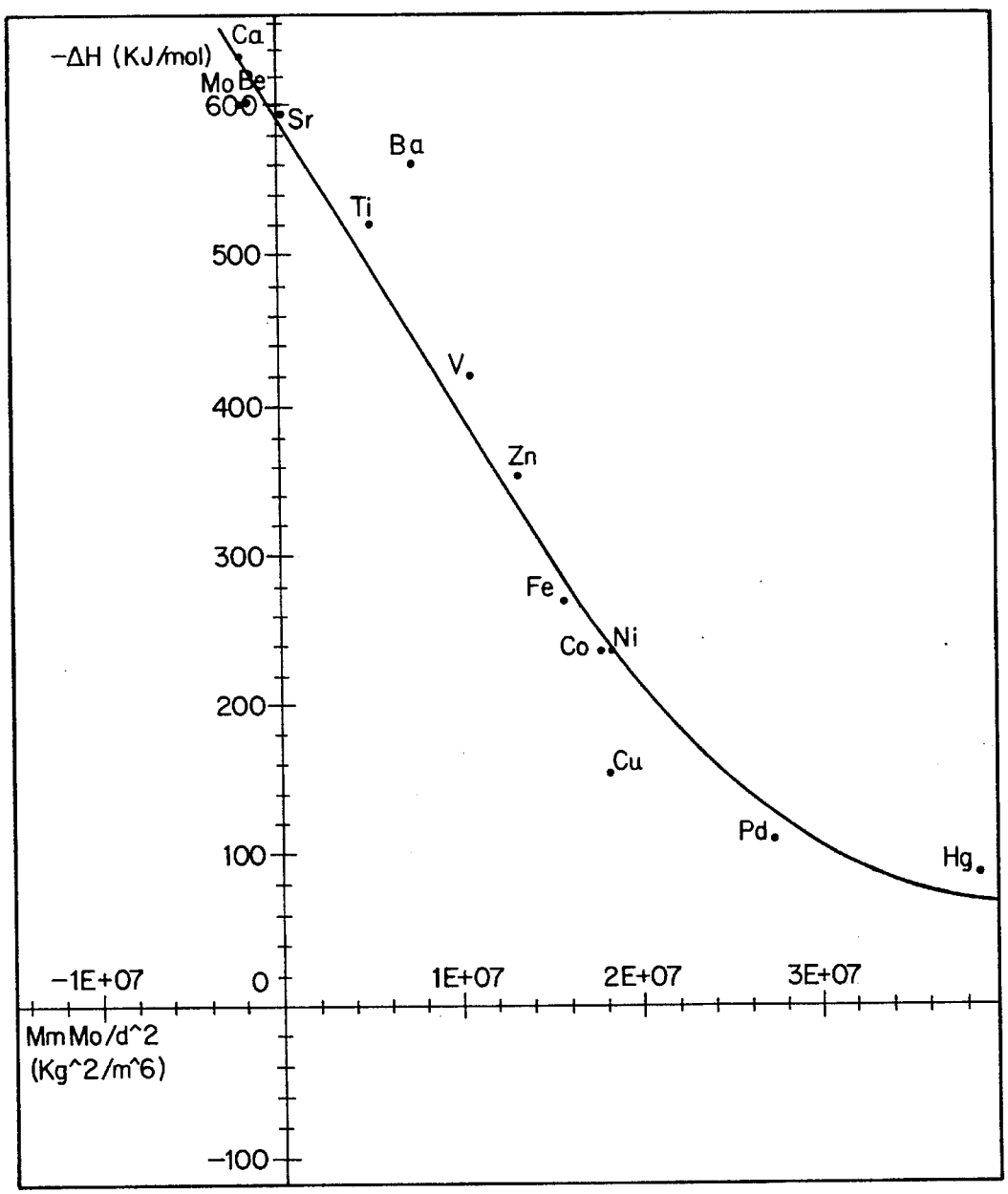
FIG. 4 is a graph plotting the heat of formation against the product of the massivities of the metal and oxygen atoms divided by the square of their interatomic distance.

However, when the heat of formation $-\Delta H$ of additional monoxides, having small values of $-\Delta H$, is plotted against the function f defined above, the curve in FIG. 4 shows a non linear region that corresponds to an exponential term which depends on the temperature T and the massivity function f, as follows:

$$V_{exp} = -k_1\, T\, exp(k_2 f) \quad (10)$$

where $k_1$ is equal to Boltzman's constant k and $k_2$ is a constant that dimensionally and by successive approximations turns out to be the inverse of Rydberg constant $R_{oo}$.

Figure 5:
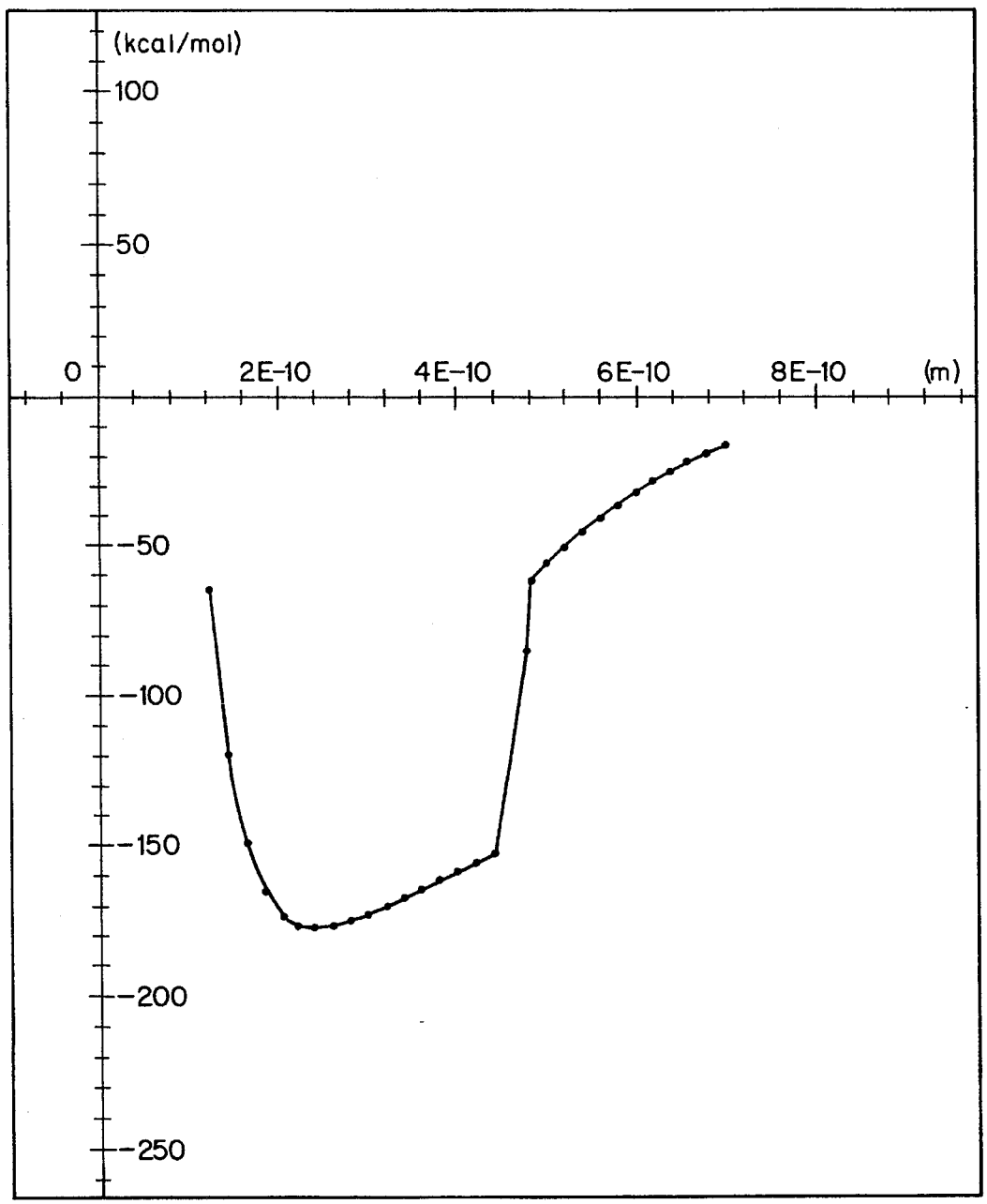
FIG. 5 is a graph illustrating the interatomic potential between zinc and oxide in terms of their massivity as a function of their interatomic distance.

Finally, by incorporating (10) to the potential model expressed in (9), the following general expression for the interatomic potential between two atoms is obtained:

$$V_{ij} = hc\, f - kT exp(f/R_{oo}) + C \quad (11)$$

and by applying (11) to the same example of the zinc and oxygen atoms as shown in FIG. 5, the curve for the interatomic potential as a function of the distance between said atoms is observed. The plot shows the energy change that takes place when the electrons are exchanged between the atoms during the formation of dissociation of the molecule, since the model takes into account the change in value of the massivities due to the difference in size of the respective neutral and ionized atoms.

In addition, since this model takes into consideration attractive as well as repulsive interactions, and is not restricted to short or long ranges, one can infer that it can be applied to other cases of interaction of matter.

By applying the above formula (11), it is possible to calculate $-\Delta H$ of different oxides (Table III). This table shows that the values obtained utilizing the massivity model coincide with the experimental values.

TABLE III

GIBBS FREE ENERGY $\Delta G$ AND HEAT OF FORMATION $\Delta H$ CALCULATED BY UTILIZING MASSIVITY POTENTIAL MODEL

| 298.1K Oxide | $\Delta G$ (eV) calculated | $\Delta G$ (eV) experimental | $\Delta H$ (eV) calculated | $\Delta H$ (eV) experimental |
|---|---|---|---|---|
| CaO | −6.322926 | −6.261889 | −6.657869 | −6.586279 |
| SrO | −5.818576 | −5.80173 | −6.15352 | −6.11783 |
| BeO | −5.970046 | −6.027664 | −6.30499 | −6.331327 |
| MgO | −5.76944 | −5.903296 | −6.104383 | −6.237015 |
| BaO | −5.443116 | −5.476303 | −5.778059 | −5.784111 |
| CdO | −2.262688 | −2.367122 | −2.597632 | −2.675968 |
| ZnO | −3.236742 | −3.29884 | −3.571687 | −3.609758 |
| FeO | −2.625726 | −2.5402 | −2.960669 | −2.759916 |
| PbO | −2.052661 | −1.957747 | −2.387605 | −2.269701 |
| HgO | −.6092703 | −.6073265 | −.9442141 | −.9410452 |

The state-of-the-art research in connection with high $T_c$ ceramic super conductive materials has been based on the synthesis of perovskite-type structures made out of mixtures of metal oxides.

The novel manganese based super-conductive compounds of the general formula Mn—M—Cu—O, where M is Sr, Ba, Be, or Ca, described above and in my earlier copending applications were predicted by the described massivity model.

Figure 6:
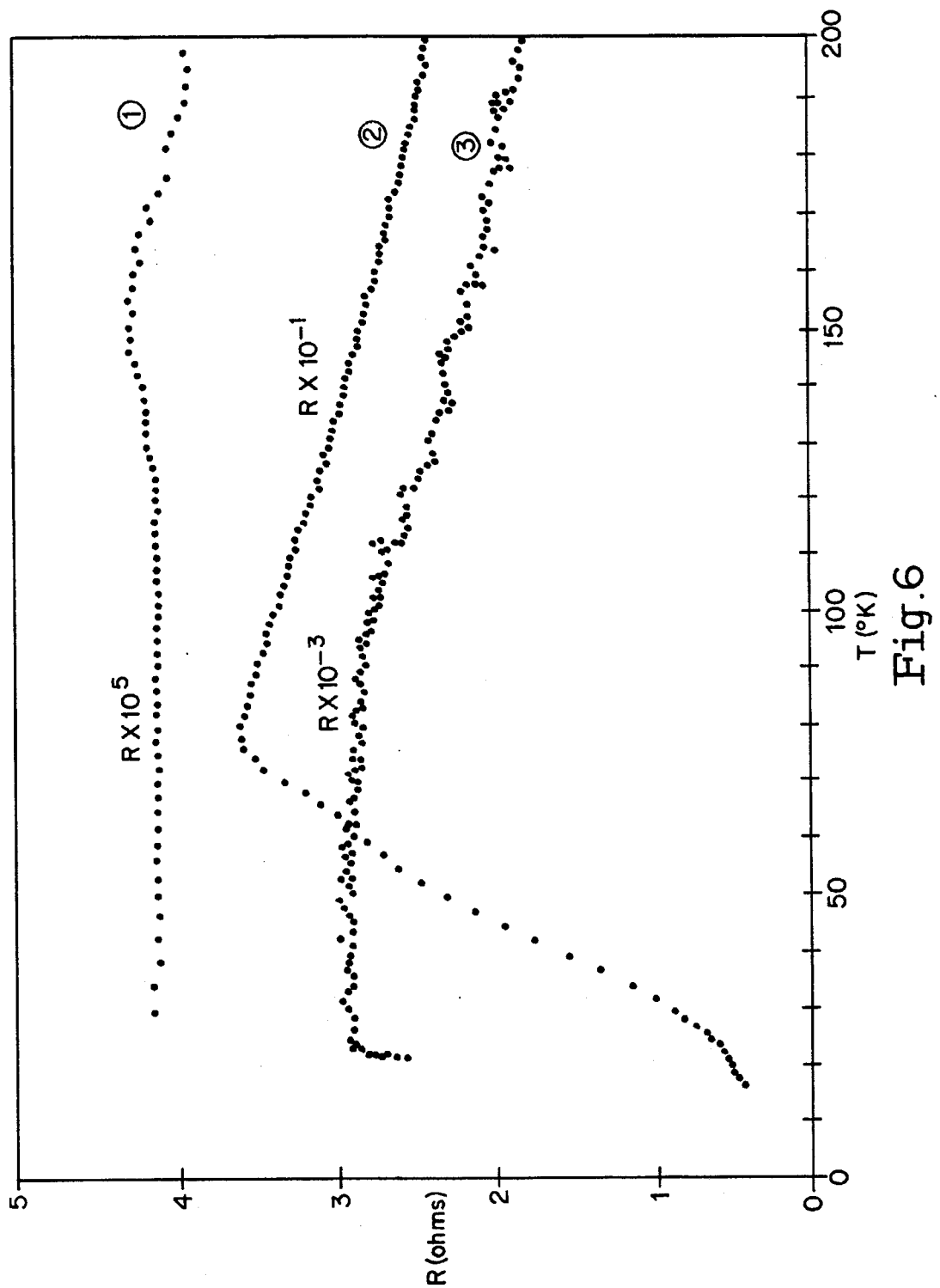
FIG. 6 is a graph plotting resistance (R=ohms) against temperature for different oxygenation times and demonstrating superconductivity as predicted by the massivity model of the invention.

Experimental work on samples of Y—Ba—Cu—O system, in which the Y atom is substituted with Mn to obtain the Mn—B—Cu—O system, was conducted, as a result of which evidence of superconductive behavior was found. The reason for selecting manganese was that the intrinsic massivity of the $Mn^{+2}$ (3.4 o×10$^{-6}$ kg/m$^2$) ion is very close to that of the $Y^{+3}$ ion (3.45×10$^{-6}$ kg/m$^2$), in accordance with the massivity model previously referred to. This was done with the intention of obtaining a superconductive transition at a temperature close to 90 K. Evidence of said superconductive transition was found by resistivity measurements which indicated a drastic drop in resistance of several orders of magnitude at approximately 80 K., FIGS. 6 and 8), which demonstrated that the prediction of the massivity model was accurate.

J. G. Bednorz and K. A. Muller in their article entitled "Possible High Tc Superconductivity in Ba—La—Cu—O System". (Zeitschrift fur Physik B-Condensed Matter 64,189–193 (1986), reported: " . . . perovskite-like-mixed valent copper compound. Upon cooling, the samples show a linear decrease in resistivity, then an approximately logarithmic increase, interpreted as a beginning of localization. Finally, an abrupt decrease by up to three orders of magnitude occurs, reminiscent of the onset of percolative superconductivity".

C. Y. Huang and M. Rabinowitz in their article entitled "Some New Aspects of Super-High Temperature Superconductors" (Modern Physics Letters B. Vol. 4, No. 9 (1990), also mention that there is "a sharp resistance transition starting from 238 K. and reaching "zero" at 228 K." in Eu $B_2Cu\, O_x$ samples, as evidence of superconductive transition.

Both of the above cited articles mention the possibility of superconductive transitions at high Tc associated with drastic resistance drops, confirming the results obtained with the materials predicted by the massivity model described herein.

More recently, B. V. Rozentuller et al., from the Institute of Chemical Physics of the Academy of Sciences of the U.S.S.R., in their article entitled "SHF absorption in low magnetic fields in Mn—V—Mo oxide systems, possible new type of high temperature superconductor" (Physics Letters A, Vol. 148, number 1, 2 (1990), refer to the possibility of superconductive transition associated with manganese in the Mn—V—Mo—O system, with no such evidence when the system is synthesized free of manganese ions.

Another conclusion reached in connection with the Cu based mixed-balance ceramic SC materials with the use of the massivity model, is the Tc inverse dependence on the interplanar distance on the C axis between Cu—O and M—O planes, where M is Y, Bi, Tl, Eu, La, Nd and other elements, including Mn, that exchange electrons through the hopping electron mechanism.

Figure 7:
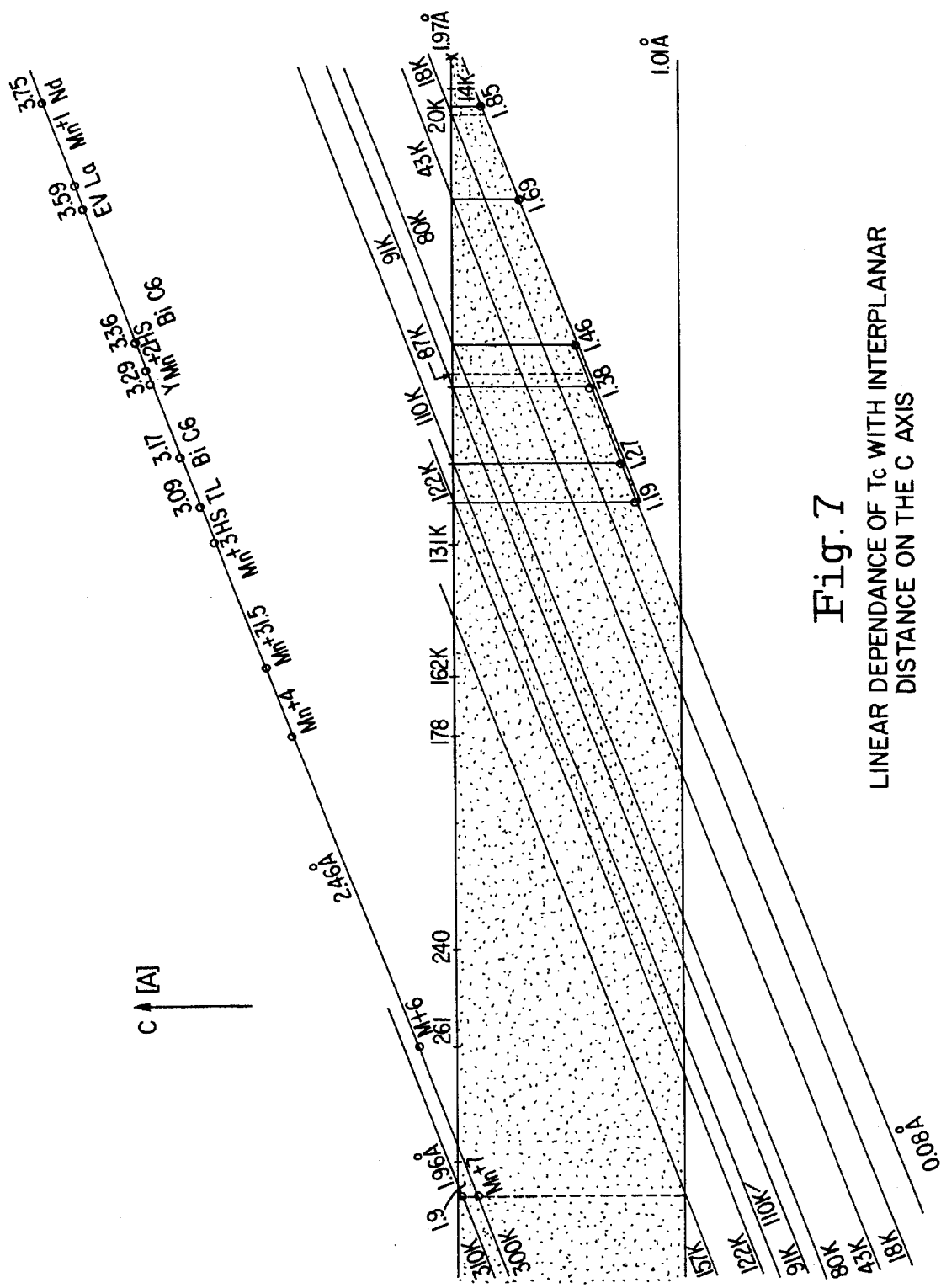
FIG. 7 is a graph which predicts the linear dependence of $t_c$ with respect to the interplanar distance.

The inventor in this case has devised a hypothesis in order to construct FIG. 7, which predicts the linear dependence of Tc vis-a-vis interplanar distance. The hypothesis explains in a coherent manner the superconductive phenomenon, based on the concept of resonance between hopping electrons and background cosmic radiation.

Penzias and Wilson, of Princeton University, found cosmic background radiation that permeates in the universe, and measured its wavelength to be equivalent to around 3 K. More recently, through experimental measurements performed by the Cosmic Background Explorer Satellite (Astronomy, June 1990), it was confirmed that the temperature of the cosmic background does not deviate from a black body spectrum having a temperature of 2.735 K. by more than one percent. Said measurement of 2.735 K. corresponds to a wave length between 0.001 and 0.0011 meters, which, in turn, corresponds to a frequency of $2.8636 \times 10^{11} \pm 0.1363 \times 10^{11}$. The inventor's hypothesis resides in associating the frequency range around the highest brightness of the black body spectrum that fits the cosmic background radiation with the frequency range of the hopping electrons between planes that exchange electrons in a solid, thus establishing that superconductive behavior appears when both frequencies coincide in a resonant manner. The frequency of the hopping electrons, in turn, depends on the interplanar distance. Based on the above, the interplanar distance range in which superconductive behavior should occur can be established in the manner shown in FIG. 7.

As it can be observed, based on the dependence of Tc on interplanar distance C, (shown in FIG. 7), the massivity model previously described above can predict with reasonable accuracy the range at which materials with superconductive characteristics can be found, without resorting to the trial and error methods of the prior art.

As shown in FIG. 7, the massivity model predicts that superconductive properties should appear at interplanar distances between 1.97 and 1.01 Å, approximately, and at temperatures corresponding to 0 K. and 366 K., approximately.

The above has been confirmed experimentally by Chikao Kawabata and Takamitsu Nakamishi of the Okoyama Computer Center of Japan, in their article entitled "A Linearlike Tc Dependence vs. Spacing d between Cu—O (or Other Elements) Sheets for C. axis in Perovskite Structure" (Journal of the Physical Society of Japan, Vol. 59, No. 11, November 1990, pp. 3835–3838 ), in which they report the analysis of electron microscope photographs of typical high Tc materials such as Tl $Ba_2Ca_3CU_4O_{11}$ (Tc=122 K.), $Bi_2 Sr_2 Ca_2 Cu_3$ O (Tc=110 K.), Y $Ba_2 Cu_3 O_7$ (Tc=91.3 K.), $Bi_2 Sr_2$ Ca $Cu_2 O_y$ (Tu=80 K.), $(Eu_{0.67}Ce_{0.33})_2(Ba_{0.67}Eu_{0.33})_2$, $Cu_3 O_8$ (Tc=43 K.) and $(Nd0.66\ Ce_{0.135}\ Sr_{0.205})_2$ Cu O y (Tc=18 K.), using a processing system attached to a large-scale general purpose computer.

The above cited experimental measurements made by the Japanese showed the existence of an exception to the linear dependence of Tc with interplanar distance for the $Tl_2Ba_2CU\ O_6$ compound, due to the fact that they considered the spacing between Cu—O planes. However, applying the massivity model of this invention and calculating the interplanar distances for the closest TlO—TlO planes that exchange electrons to be 3.44 Å, it is possible to predict a Tc=70 K., which is consistent with experiment (A. W. Hewat et al, Physics C156 (1988)), thus demonstrating the validity of the massivity model.

Obviously, in order to obtain superconductive compounds with a higher Tc, it is necessary to reduce the interplanar distance between planes that exchange electrons. To accomplish that, it is required to introduce elements with smaller ionic radii that are capable of: (i) maintaining the original perovskite structure, and (ii) exchanging electrons to achieve resonance, as mentioned before, within the established range shown in FIG. 7.

What is claimed is:

1. A process of manufacturing a superconducting compound comprising mixing stoichiometric amounts of a metallic oxide, copper oxide and a metallic carbonate selected from the group of calcium carbonate, barium carbonate, or strontium carbonate, wherein the metal of said metallic oxide is other than yttrium and is selected and identified by its intrinsic massivity $M_i$ which is a function of its massivity $$M_{ic}=(d_{ic}-r_i)m_i/V_i=(1-d_{ic}/r_i)(-r_i m_i/V_i)$$

where $m_i$, $V_i$, and $r_i$ represent its mass, volume and radius, respectively, and $d_{ic}$ equals the distance from the center of the mass of the body to the center of massivity with respect to another body, the intrinsic massivity $M_i$ corresponding to $d_{ic}=0$ or $M_i=r_i\ m_i/V_i$ and by making $(1-d_{ic}/r_i)=B_{ic}$ the massivity $M_{ic}=B_{ic}\ M_i$ where $B_{ic}$ is a coupling factor, the intrinsic massivity of said metal being close in value to the intrinsic massivity of yttrium, and wherein the interplanar distance on the C axis between Cu—O planes that exhange electrons through the electron-hopping mechanism in the ceramic perovskite is within the range of 1.97 Å and 1.01 Å; subjecting the mixture to pressure to form pellets; and heating the pellets.

2. The compound produced by the process defined in claim 1.

3. A ceramic composition having the formula $Mn_2\ Sr_2\ Cu_3\ O_{7-x}$.

4. A ceramic composition having the formula $Mn\ Sr_2\ Cu_3\ O_{7-x}$.

* * * * *